United States Patent [19]

Murakami

[11] Patent Number: 5,450,009
[45] Date of Patent: Sep. 12, 1995

[54] MAGNETIC SENSOR AND STRUCTURE OF ITS MOUNTING

[75] Inventor: Taku Murakami, Hiratsuka, Japan

[73] Assignee: Kabushiki Kaisha Komatsu Seisakusho, Tokyo, Japan

[21] Appl. No.: 81,265

[22] PCT Filed: Dec. 27, 1991

[86] PCT No.: PCT/JP91/01783
§ 371 Date: Jun. 23, 1993
§ 102(e) Date: Jun. 23, 1993

[87] PCT Pub. No.: WO92/12438
PCT Pub. Date: Jul. 23, 1992

[30] Foreign Application Priority Data

Dec. 28, 1990 [JP] Japan ................. 2-405661
Mar. 29, 1991 [JP] Japan ................. 3-027817

[51] Int. Cl.⁶ ............... G01B 7/30; G01B 7/14; G01R 33/06
[52] U.S. Cl. ............ 324/207.21; 324/207.24; 324/207.25
[58] Field of Search ......... 324/207.2, 207.21, 207.25, 324/251, 252, 207.24, 207.15

[56] References Cited

U.S. PATENT DOCUMENTS

| 3,928,802 | 12/1975 | Reinecke | 324/174 |
| 4,745,363 | 5/1988 | Carr et al. | 324/207.2 |
| 4,992,733 | 2/1991 | Griebeler | 324/207.21 |

FOREIGN PATENT DOCUMENTS

| 55-97825 | 7/1980 | Japan . |
| 59-44673 | 3/1984 | Japan . |
| 59-45719 | 3/1984 | Japan . |
| 60-117407 | 6/1985 | Japan . |
| 60-155917 | 8/1985 | Japan . |
| 1-41226 | 9/1989 | Japan . |

*Primary Examiner*—Walter E. Snow
*Attorney, Agent, or Firm*—Richards, Medlock & Andrews

[57] ABSTRACT

A gradient bias magnetic field is applied to MR elements to improve precision of detection and prevent magnetic disturbance, and the structure of mounting the sensor is simplified. For this purpose, a magnet (10) is provided on the back surface side of the MR elements (12a, 12b) to generate a magnetic field at right angles with the above surfaces, and ferromagnetic members (34) are arranged on the sides of the MR elements (12a, 12b) to bend the magnetic flux $\phi$ generated by the magnet (10) such that a parallel bias magnetic field acts upon the MR elements (12a, 12b).

17 Claims, 6 Drawing Sheets

MAGNETIC SENSOR AND STRUCTURE OF ITS MOUNTING

FIELD OF THE INVENTION

This invention relates to a magnetic sensor and mounting structure therefor, which uses a magnetism-to-electricity converting element, such as a magneto-resistive element made of a thin ferromagnetic film material or a semiconductor crystalline element.

BACKGROUND ART

Conventionally, a linear position sensor or a rotary encoder employs a magnetic sensor with a thin ferromagnetic film magneto-resistive element made of, for example, an Fe-Ni alloy or a Co-Ni alloy. The thin ferromagnetic film magneto-resistive element (hereinafter referred to as an MR element) is generally magneto-anisotropic with respect to a particular direction beneath the film surface. It has high sensitivity to the magnetic field parallel to the film surface while having low sensitivity to the magnetic field generated along the thickness of the film surface.

With respect to this, in a magnetic sensor having an MR element, a magnet is used to generate the magnetic field in the direction of the film thickness of the MR element. Movement of the magnetic sensor along a magnetic scale, or a detected member, causes change in the magnetic flux of the component parallel to the film surface, with the amount of the change being considerable, thereby improving the detection sensitivity of the magnetic sensor. (See, Japanese Published Examined Patent Application (B2) No. 1-41226.) More particularly, as shown in FIG. 8(A), an MR element 12, affected by the bias magnetic field generated by a magnet 10 positioned at right angles to the film surface, moves along an arrow A, relative to a scale 14 having its magnetic characteristics varied by, for example, profile changes, to either the position illustrated in FIG. 8(B) or the position illustrated in FIG. 8(C), which results in the magnetic flux $\phi$ with gradient. Consequently, the magnetic field component parallel to the element surface acts upon the MR element, varying its electrical resistance to produce a detection signal.

However, the electrical resistance of the MR element 12 varies, as shown in FIG. 9, symmetrically with the direction of the magnetic field. Thus, as described above, the application of the bias magnetic field at right angles to the film surface of the MR element 12 causes the direction of the magnetic flux $\phi$ to be bent to the right in FIG. 8(B) and to the left in FIG. 8(C). No linearity can be obtained at a position along the film surface where the component of magnetic field intensity is approximately equal to zero. This results in a distortion of the output signal. With respect to this, it has been proposed to arrange the MR element in an inclined manner relative to the scale 14, and to apply a bias magnetic field (so-called transverse bias magnetic field) having a component parallel to the film surface in the MR element 12, in order to use it in linear regions a and b in FIG. 9. (See, Japanese Published Unexamined Patent Application (A) No. 60-155917.)

However, the magnetic sensor of the type described requires the arrangement of the MR element 12 in an inclined manner to the scale 14. This means that the MR element 12 is difficult to assemble, and besides, only a complicated structure can hold an inclined MR element 12. In addition, it has another disadvantage of impossibility of axial-symmetrical application of the transverse magnetic field to the sensor surface.

Additionally, a conventional magnetic sensor protects the MR element 12 by containing the MR element 12 in a sensor housing. Such conventional housing is made of a non-magnetic material to prevent, to the extent possible, the MR element 12 from being affected magnetically. It is designed to position the magnet 10 in an ideal space. Further, it has a structure such that a magnetic shield is sufficiently away from the magnet 10 for the bias magnetic field, even when the magnetic shield of the magnetic sensor is required, to avoid in every way any effect on the magnetic field generated by the magnet 10.

However, a magnetic sensor 11 used under highly loaded hostile environment in construction equipment or the like is frequently subjected to a sudden disturbance such as generation of intense magnetic field noise inherent to the engine spark. In addition, fine magnetic powders or other polarized foreign matter may often adhere on a measurement member of the scale 14 or the like. Thus the MR element 12 is affected by the magnetic circumstances despite a conventional case or a cover as the protective member being composed of non-magnetic material. There is a disadvantage that the origin has an increased drift, thereby degrading the detection precision of the magnetic sensor 11.

In addition, if a conventional magnetic sensor 11 is required to be arranged in contact with the detected member as the measurement member such as the scale 14, a sensor hole 15 is formed in a holder 13 disposed in opposition to the scale 14 and the magnetic sensor 11 is inserted into the sensor hole 15. A spring 17 is interposed between the upper end of the magnetic sensor 11 and the bottom surface of the sensor hole 15 so that the spring 17 urges the magnetic sensor 11 against the scale 14.

However, such conventional structure of mounting may cause an inclined positioning of the sensor 11 to the scale 14 due to the precision of attachment (parallelism) of the holder 13 to the scale 14 or due to inclined working of the sensor hole 15. This results in so-called one-side contact of the magnetic sensor 11. It is difficult to overcome the one-side contact problem only by means of improving workability, assembly or the dimensional tolerance. Thus a smooth relative movement between the scale 14 and the magnetic sensor 11 cannot be achieved due to the one-side contact of the magnetic sensor 11, resulting in defects of localized heating or short lifetime of the magnetic sensor due to the greater friction.

In addition, in a magnetic sensor used for a position detecting device, a linear scale or a rotary encoder to detect stroke amount of a hydraulic cylinder, the sensor is disposed in contact or close relation to the detected member. As shown in FIG. 11, the magnetic sensor 11 comprises the magnet 10 arranged above the MR element 12 through a base plate or the like (not shown) to apply the bias magnetic field to the MR element 12. Further, the magnetic sensor 11 comprises a sensor cover 16 made of a non-magnetic material like Be-P and disposed on the front surface, or the detection surface, of the MR element 12. A magnetic shield 18 surrounds the MR element 12 and the magnet 10. A rod 20 of a cylinder is made of a magnetic material, around which a peripheral groove 22 is formed in its peripheral surface at a predetermined pitch (e.g., pitch of 2 mm) and a predetermined depth (e.g., 50 μm) and width. Chrome plating 24 is applied on the surface.

When the magnetic sensor 11 and the rod 20 make relative movement, a gap fluctuation or a fretting friction is caused therebetween. In addition, if the magnetic sensor 11 is used in contact with the rod 20, the sensor characteristic is varied due to heating of the magnetic sensor 11. Thus, in order to prevent the magnetic sensor 11 from being worn or broken as a result of direct contact with the detected member, or to keep a constant distance between the magnetic sensor 11 and the detected member, a protective member is often attached to a tip portion of the magnetic sensor 11.

More particularly, as shown in FIG. 12, a conventional sensor comprises a protective member 19a in the form of a cap covering the whole tip portion of the magnetic sensor 11 to engage the cap-like protective member 19a with the magnetic sensor 11. Alternatively, a protective member 19b is formed like a hollow cylinder as shown in FIG. 13, and the hollow cylindrical protective member 19b is fitted to the tip portion of the magnetic sensor 11. Otherwise, the magnetic sensor 11 is contained in a protective case 19c as shown in FIG. 14.

However, when the cap-like protective member 19a or hollow cylindrical protective member 19b is fitted to the magnetic sensor 11, it tends to slip off due to vibration or the like. If the magnetic sensor 11 is adhered to the protective member 19a, 19b only to avoid the slip-off, it becomes impossible to replace the protective member 19a, 19b when worn or damaged. This results in a shorter lifetime of the magnetic sensor 11. When the whole magnetic sensor 11 is contained in the protective case 19c as shown in FIG. 14, there are defects of increased cost and complicated structure because a supporting mechanism should be disposed for the magnetic sensor 11 within the protective case 19c.

SUMMARY OF THE INVENTION

The present invention is directed to overcome the above mentioned problem inherent to the prior art, and a first object thereof is to provide a magnetic sensor in which a bias magnetic field at optimum gradient acts on an MR element and in which the MR element can be readily assembled. A second object is to provide a magnetic sensor capable of reducing influence due to magnetic disturbance. A third object is to provide sensor mounting structure to avoid one-side contact of a sensor when the magnetic sensor is disposed in contact with a detected member. A fourth object is to provide a sensor protective member mounting structure with which cost for the sensor is reduced without slip-off caused by vibration or the like.

In order to achieve these objects, a first embodiment of the present invention provides, in a magnetic sensor having an MR element for converting magnetic variation into an electrical signal and a magnetic field generator disposed on the back of the element to generate the magnetic field crossing at right angles to the element, a ferromagnetic material disposed at a side of the MR element.

The ferromagnetic material can be arranged about the entire periphery of the side of a material where the MR element is disposed. The MR element can be deviated to either direction of relative movement with the detected member related to the center of the material. Alternatively, a plurality of MR elements are disposed on a common base plate and the ferromagnetic material can be arranged about the side of the base plate. These MR elements can be arranged separately on both sides in the direction that the detected member makes the relative movement with respect to the center of the base plate.

A second embodiment of the present invention mounts, in the magnetic sensor having the MR element(s), a weak ferromagnetic material on at least one of the periphery of the MR element and a front surface thereof.

A third embodiment of the present invention is the structure wherein the magnetic sensor, making the relative movement in contact relation with the detected member, is mounted on a holder which has a sensor hole into which the magnetic sensor is inserted, an elastic deforming member is interposed between the holder and the side portion of the magnetic sensor inserted into the sensor hole, and a spring urges the magnetic sensor against the detected member.

A fourth embodiment of the present invention is the structure in which a protective member is threadedly mounted to the tip portion of the magnetic sensor to prevent the magnetic sensor from making contact with the measured object.

This protective member can be a synthetic urethane resin having, for example, cushion function against the chatter vibration, a fluorocarbon resin having good scoring resistance for improving the slidability, a synthetic epoxy resin having good heat resistance, a super engineering plastic having good heat resistance and slidability, or a phenol resin having good incombustibility.

In the first embodiment of the present invention described above, the magnetic field, generated by the magnetic field generator for the bias magnetic field disposed on the back surface of the MR element, is bent to all directions from the center due to the ferromagnetic material arranged on the side of the MR element. In other words, selecting conditions and forming bias at 45 degrees are expected to improve the characteristics. Thus, the bias magnetic field acting on the MR element becomes the magnetic field gradient to the MR element having the component along the surface of the element, which is applicable in the linear region of the output characteristic of the MR element to obtain the high precision of detection. In addition, it is enough only to dispose the ferromagnetic material adjacent to the side of the MR element. There is no need of inclining the MR element to the detected member, which facilitates assembling of the MR element and in turn simplifies the structure of the magnetic sensor. In addition, the ferromagnetic material adjacent to the side of the element contributes to the protection of the magnetic sensor from disturbances like the electromagnetic wave under the hostile environment such as construction equipment.

By arranging the ferromagnetic material along the entire periphery of the side of the base plate where the MR element is disposed, the ferromagnetic material serves as a magnetic shield to reduce the influence by the disturbance as well as providing good mechanical strength while improving the environmental resistance. In addition, when a magnet is used as the magnetic field generator, the ferromagnetic material reduces the attenuation of the magnetic flux generated by the magnet. Thus the lifetime of the magnet is increased, thereby improving the durability of the magnetic sensor.

In addition, by offsetting the MR element to either side of the base plate, it becomes possible to saturate the magnetization on detection. As a result, it is less affected by a temperature change and, when, for example, the magnetic sensor is applied to the magnetic scale or the like, it becomes possible to have detection precision in the measurements. Further, when the MR elements are distributed to either side with respect to the center of the base plate, compensation of a temperature change or the like becomes possible by calculating the difference between the two under the condition where the magnetic flux distributions are equal to or approximate each other. Thus, the detection precision is also improved.

If the bias magnetic field is applied along the surface of the MR element, it is not necessary that the ferromagnetic material be disposed along the entire periphery of the side of the base plate where the MR element is disposed. It can be disposed on either side or both sides of the base plate.

The second embodiment of the present invention arranges, on at least one of the periphery and the front surface of the magnetic sensor, so-called weak ferromagnetic material where ferromagnetic powders are dispersed in, for example, resin or rubber, whereby the weak ferromagnetic material serves as the magnetic shield to avoid the magnetic disturbance. Further, the use of the weak ferromagnetic material reduces any magnetic influences in the MR element due to the magnetic shield.

The third embodiment of the present invention interposes an elastic deformation member between the magnetic sensor and the holder. Thus, even when the magnetic sensor is mounted on and inclined to the detected member, the elastic deformation member is deformed by the press of the magnetic sensor against the detected member to force the proper inclination of the magnetic sensor. It contributes to avoiding the creation of a flaw on the detected member or the magnetic sensor. Besides, the relative movement of the two can be smoothly made to reduce the localized heating or the wearing.

In the fourth embodiment of the present invention, the protective member is threadedly mounted to the sensor body. Accordingly, the protective member does not slip-off the sensor body even when the detected member oscillates and contacts with the sensor causes vibration or impact. Thus, it is unnecessary to form the protective member as the case covering the whole sensor body, thereby reducing the cost for the sensor.

BEST MODE FOR CARRYING OUT THE INVENTION

Figure 1:
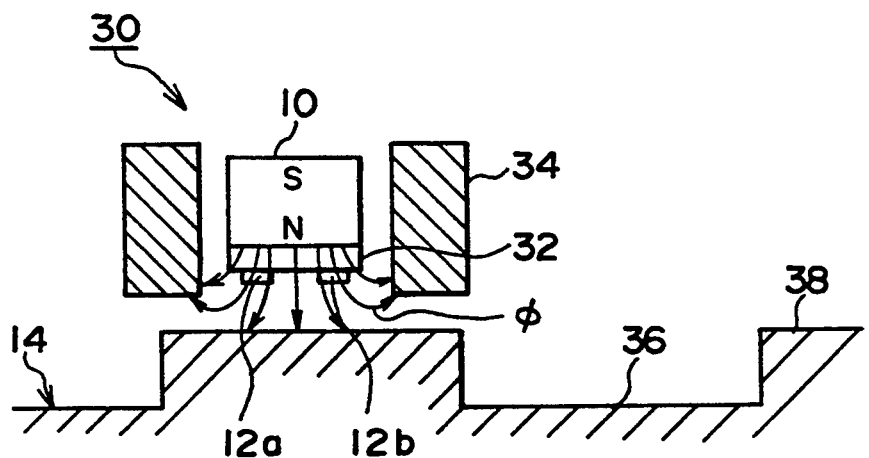
FIG. 1 is a front sectional view of a magnetic sensor according to a first embodiment of the present invention.
Figure 2:
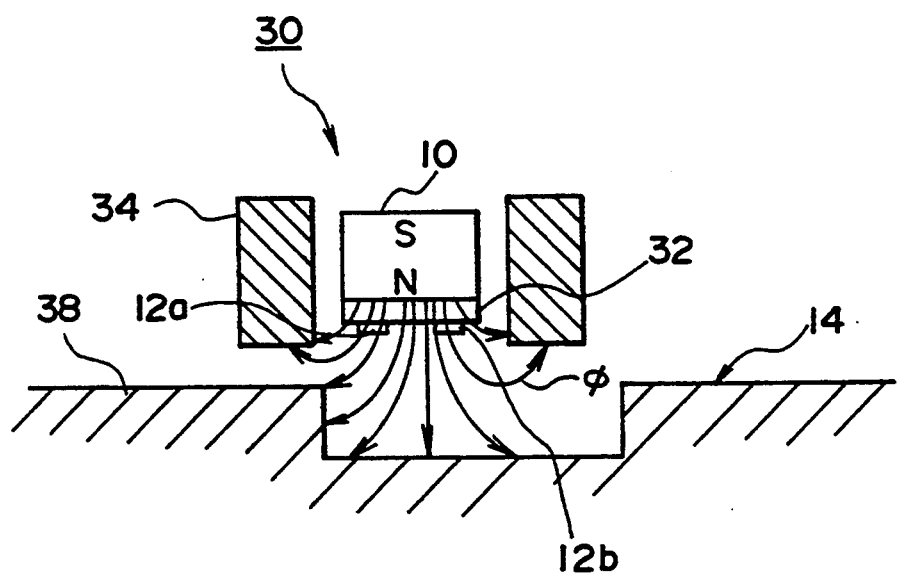
FIG. 2 is a operational diagram of the first embodiment.

Embodiments of the present invention will be described in detail with reference to the drawings. Similar parts are shown with like reference numerals as the ones described in conjunction with the prior art and description thereof will be omitted.

FIG. 1 is a sectional view of a magnetic sensor according to a first embodiment of the present invention. A magnetic sensor 30 comprises two MR elements 12a and 12b serving as magnetic-to-electric converting elements disposed on one side of a base plate 32. Each of the MR elements 12a and 12b is made of a thin ferromagnetic film of, for example, an Fe-Ni alloy or a Co-Ni alloy such that it is sensitive to the left-to-right magnetic field. Each of the MR elements 12a and 12b is deviated to either right or left relating to FIG. 1 with respect to the center of the base plate 32.

On the other hand, a magnet 10 acting as a magnetic field generator is disposed on the back surface of the MR elements 12a and 12b, or on the side of the base plate 32 which is opposite the back surface of each of the MR elements 12a and 12b. The magnet 10 has the N pole in contact with the base plate 32 and the N pole is arranged in parallel to the base plate 32 such that a magnetic field can be generated that is at right angles to the film surfaces of the MR elements 12a and 12b. In addition, a ferromagnetic material 34 consisting of, for example, iron in the form of a hollow cylinder, is provided by the sides of the base plate 32 having the MR elements 12a and 12b. Thus, the magnetic flux $\phi$ from the N pole of the magnet 10 is bent by attraction to the ferromagnetic material 34, and permeates through the MR elements 12a and 12b gradiently. In other words, each of the MR elements 12a and 12b is in a condition equivalent to an arrangement within the magnetic field where the direction of the magnetic field is inclined to the element surface, i.e., is in a condition where so-called transverse bias magnetic field is applied having left-to-right components (transverse components) in the figure along the element surface.

Figure 9:
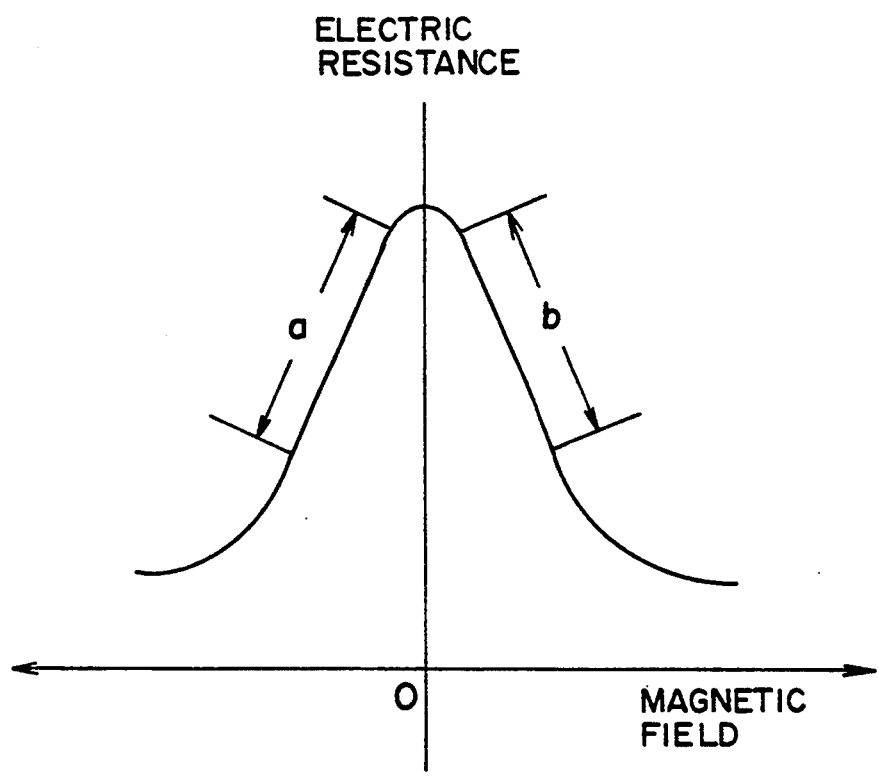
FIG. 9 is a characteristic curve showing the change of the electrical resistance relative to the intensity of the magnetic field of the MR element.
Figure 10:
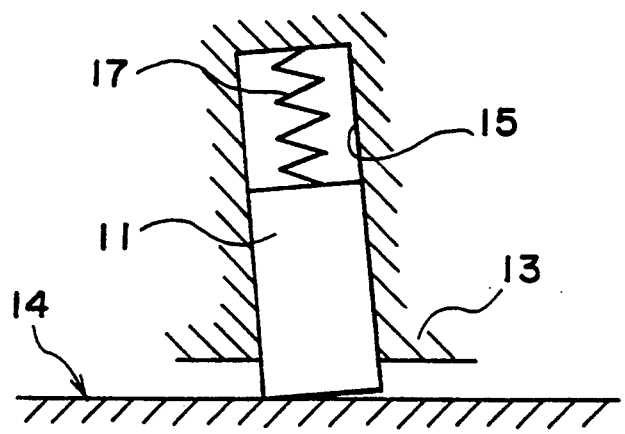
FIG. 10 is a front sectional view showing a conventional structure for mounting a magnetic sensor.
Figure 11:
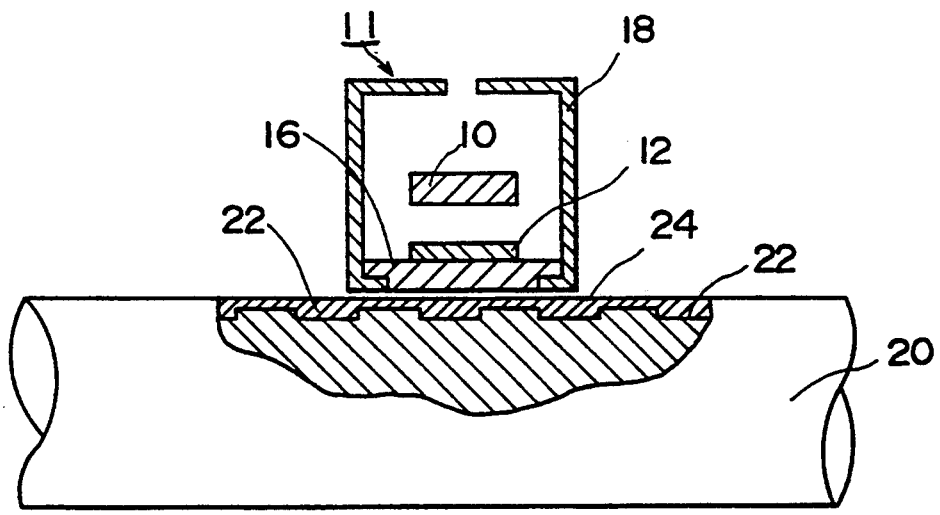
FIG. 11 is a front sectional view of a conventional magnetic sensor used as a position detecting device for a cylinder.
Figure 12:
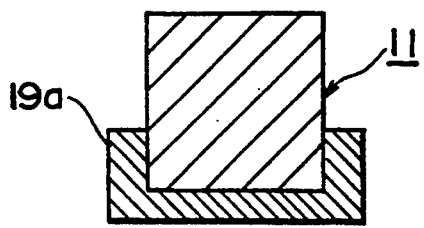
FIG. 12 is a front sectional view showing a conventional structure having a cap-like protective member.
Figure 13:
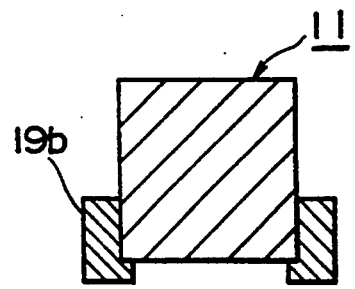
FIG. 13 is a front sectional view showing a conventional structure having a hollow cylindrical protective member.

The magnetic sensor 30 is so arranged that each of the MR elements 12a and 12b faces measurement elements consisting of a concave portion 36 and a convex portion 38 formed on the scale 14. The position where each of the MR elements 12a and 12b is arranged depends on the intensity of the magnetic field generated by the magnet 10 or on the distance relating to the ferromagnetic material 34 as long as each of the MR elements 12a and 12b can be used in the linear regions a and b of the characteristic curve shown in FIG. 9. Briefly, when each of the MR elements 12a and 12b makes relative movement to the scale 14, it is ensured that the transverse bias magnetic field acting on each element will not be reversed.

The operation of this embodiment, having a structure as described above, is as follows.

Each of the MR elements 12a and 12b is connected to a well-known detection circuit to form a bridge. Either the magnetic sensor 30 or the scale 14 moves in the right-to-left direction in the figure to cause the relative movement therebetween. When the MR element 12a comes near to an edge of the convex portion 38 formed on the scale 14, the magnetic flux $\phi$, permeating through the MR element 12a, is further bent, being affected by the convex portion 38. Thus, the transverse component of the magnetic field acting on the MR element 12a becomes larger, thereby reducing the electrical resistance of the MR element 12a. On the other hand, in the MR element 12b, the bend of the permeating magnetic flux $\phi$ is reduced and the transverse component of the magnetic field is also reduced, thereby increasing the resistance. Accordingly, obtaining a difference therebetween makes it possible to obtain a large output signal, and thereby carry out compensation or the like against a temperature change.

In other words, in this embodiment, it is possible to produce the transverse bias magnetic field on each of the ME elements 12a and 12b by only arranging the ferromagnetic material 34 adjacent to the sides of the base plate 32 where each of the MR elements 12a and 12b is disposed. It also becomes possible to improve the characteristics with the gradient bias to eliminate distortion in the output signal.

In the present embodiment, it is unnecessary to incline the MR elements 12a and 12b to the scale 14 as the detected member, so that it is easy to arrange the MR elements 12a and 12b. Besides, the structure of the magnetic sensor 30 can be simplified. In addition, by means of arranging the ferromagnetic material 34 about the periphery of the MR elements 12a, 12b and the magnet 10, the mechanical strength is improved to improve the environmental resistance. Further, the ferromagnetic material 34 contributes to a reduction of the attenuation of the magnetic flux generated by the magnet 10, which increases the lifetime of the magnet 10, and the durability of the sensor is also improved. Moreover, arrangement of the ferromagnetic material 34 around the MR elements 12a and 12b makes it possible to achieve a magnetic shield, thereby reducing influence due to a magnetic disturbance.

While this embodiment has thus been described in conjunction with the MR elements 12a and 12b arranged on both sides with respect to the center of the base plate 32, it is possible to form half-bridge or full-bridge by means of arranging a plurality of MR elements such as two for each side or four for each side, respectively. In addition, the MR elements 12a and 12b can be arranged on either side with respect to the center of the base plate 32. In this event, the magnetization of the MR elements 12a and 12b will be saturated upon, for example, detection of the convex portion 38 of the scale 14, improving the temperature characteristics and thereby improving the detection precision of the scale.

While the description of the present embodiment has thus been made in conjunction with the use of MR elements 12a and 12b made of a thin ferromagnetic film magneto-resistance element, other magnetic-to-electrical converting elements can also be used such as a semiconductor magnetic resistance element or a magnetic diode. Further, in the present embodiment, the description has been made in conjunction with the use of magnet 10 as the magnetic field generator. However, a coil can be equally used as the magnetic field generator.

In addition, in the present embodiment, while the description has thus been made in conjunction with the scale 14 having measurement elements formed by profile changes, the measurement elements can be made by means of a local polarization. Further, in the present embodiment, while the description has been made in conjunction with the scale 14, as the detected member, capable of moving in a straight line, the detected member can be a rotary member like a disk.

Figure 3:
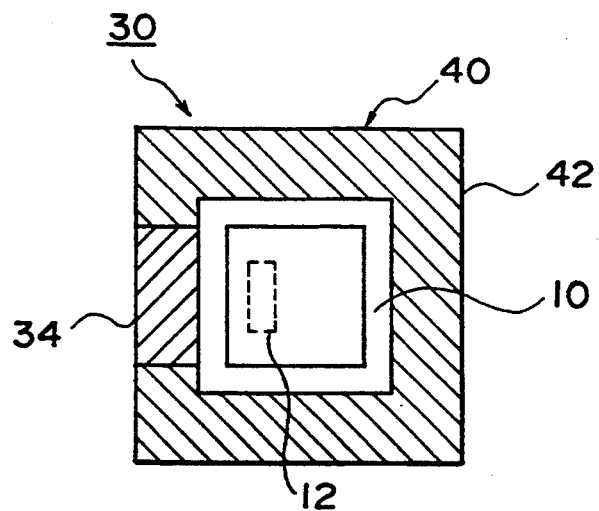
FIG. 3 is a plan sectional view of an application of the first embodiment.

FIG. 3 is a plan sectional view of an application of the first embodiment. In this embodiment, a sensor housing 40 is formed with the ferromagnetic material 34 and a nonmagnetic material 42 for containing the MR element 12 and the magnet 10. The ferromagnetic material 34 is provided on one side of the magnet 10. Further, the MR element 12 is so disposed as to be shifted toward the ferromagnetic material with respect to the center of the base plate which is not shown.

In the present embodiment, it is also possible to apply the magnetic field at the transverse to the MR element 12 to achieve an effect equivalent as in the case shown in FIG. 1. The MR element 12 can be centered on the base plate or a plurality of MR elements 12 can be provided to form a bridge. In addition, like the first embodiment, it is possible to arrange the ferromagnetic material 34 on both sides of the magnet 10 and to arrange the MR elements 12 on the sides with respect to the center.

Figure 4:
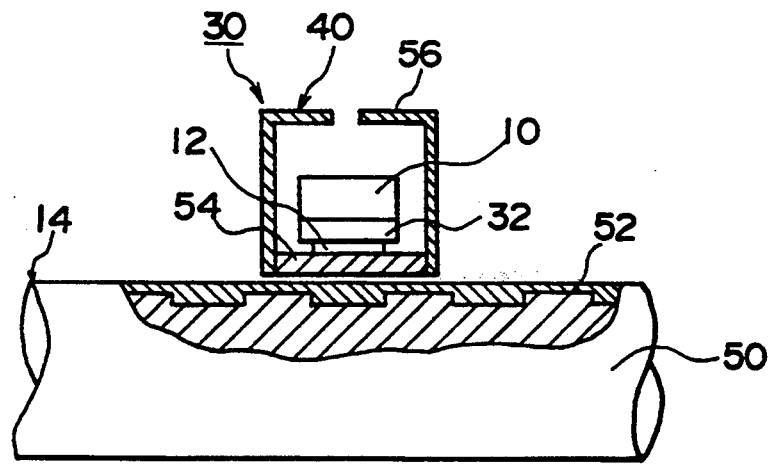
FIG. 4 is a front sectional view of a second embodiment.

FIG. 4 is a front sectional view of a second embodiment. The scale 14 as the detected member comprises a peripheral groove of, for example, 50 $\mu$m depth at a predetermined pitch along the periphery of the cylinder rod 50 formed of the magnetic material and the surface is formed with the profile changes. The surface of the rod 50 has a chrome-plated layer 52 to cover the profile changes.

The magnetic sensor 30 comprises the MR element 12 on the surface of the base plate 32 which is closer to the scale 14. Secured on the other surface is the magnet 10 for the bias magnetic field. On the surface of the MR element 12 facing the scale 14, a sensor cover 54 made, for example, of Be-Cu, is provided, forming a portion of the sensor housing 40. A magnetic shield 56 is attached to the sensor cover 54 so as to cover the MR element 12 and the magnet 10.

The magnetic shield 56 is made of a so-called weak ferromagnetic material prepared by mixing either a metal having 3d electrons such as Fe,- Co, and Ni, or a rare earth having 4f electrons such as Td, Du, and Ho, into a non-magnetic material such as resin or rubber.

In the second embodiment constructed like the above, the magnetic shield 56 shields against the magnetic noise caused upon sparking of a motor or an engine. In addition, the magnetic shield 56 is less affected by magnetic powders adhered to the scale 14, thereby improving the detection characteristics.

For example, located near an electromagnetic motor, the magnetic sensor 30 according to the present invention prepared by forming the sensor housing 40 with a Teflon resin mixed with 5% Ni powders was compared with a magnetic sensor in a conventional Teflon resin sensor. The results show that the sensor according to the present invention is less affected by the disturbance than the conventional sensor and the S/N ratio is increased by 20%.

While the present embodiment has thus been described in conjunction with the sensor cover 54 made of a non-magnetic material, the sensor cover 54 can be made of a weak ferromagnetic material similar to that of the magnetic shield 56. In addition, it is also possible to provide the magnetic shielding effect only for the sensor cover 54.

Figure 5:
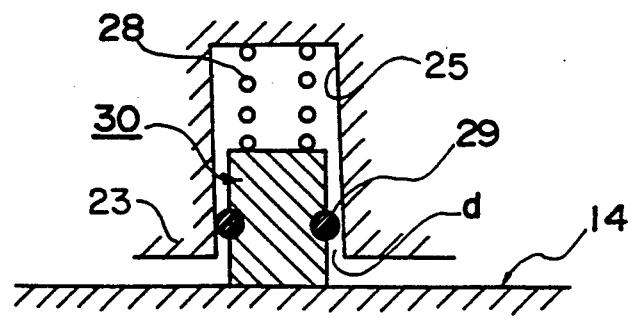
FIG. 5 is a front sectional view showing a mounting structure for a magnetic sensor according to a third embodiment.

FIG. 5 is a front sectional view of the mounting structure according to the third embodiment of the present invention.

A sensor hole 25 of a holder 23 into which the magnetic sensor 30 is inserted is formed such that the diameter thereof is sufficiently larger than the outer dimension of the magnetic sensor 30 to form a cavity d between the inner wall of the sensor hole 25 and the magnetic sensor 30.

The magnetic sensor 30 has a peripheral groove formed in the side portion inserted into the sensor hole 25. This peripheral groove engages with a ring-like elastic deformation member 29 made of, for example, NDR or silicone rubber. An elastic deformation member 29 has a diameter such that it projects from the peripheral groove formed in the magnetic sensor 30 to contact the inner wall of the side portion of the sensor hole 25 when mounted to the magnetic sensor 30.

According to the structure of the present embodiment, it is possible to prevent the magnetic sensor 30 from being in one-side contact in pressing the magnetic sensor 30 to the scale 14 even when the parallelism between the scale 14 and the holder 23 is improper or when the sensor hole 24 is inclined as shown in FIG. 5.

More particularly, if the one side of the magnetic sensor 30 contacts the scale 14, it is urged to the scale 14 by a spring 28 disposed on the bottom of the sensor hole 25. In this event, the elastic deformation member 29 deforms to rotate the magnetic sensor 30. The inclined magnetic sensor 30 is forced to straighten, thereby the front surface of the magnetic sensor 30 is joined to the scale 14. As a result, the detection precision of the magnetic sensor 30 can be improved and the smooth relative movement can be achieved between the scale 14 and the magnetic sensor 30. It contributes to a reduction of the wearing of the magnetic sensor 30 or the scale 14 while minimizing heating.

Figure 6:
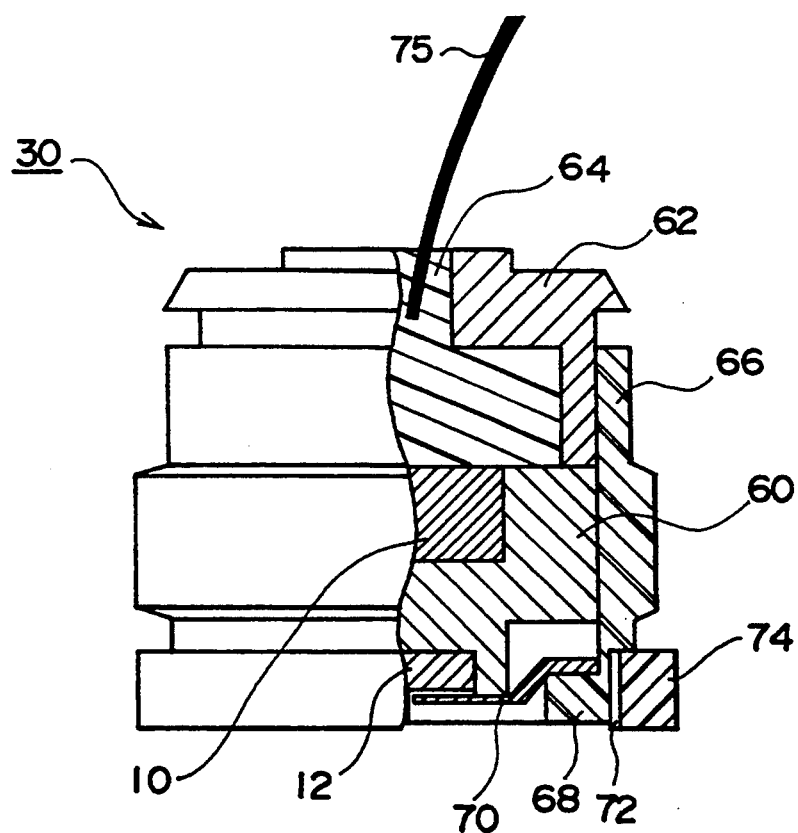
FIG. 6 is a front view, partly in cross section, showing a structure for mounting a sensor protective member according to a fourth embodiment.

FIG. 6 is a front view, partially in cross section, showing the structure of mounting a sensor protective member according to a fourth embodiment of the present invention. The magnetic sensor 30 comprises the MR element 12 at its bottom, and a permanent magnet 10 is disposed over the MR element 12 by a spacer 60 to apply the bias magnetic field to the MR element 12. Over the spacer 60, a hollow cylindrical fitting portion 62 is formed to ensure fitting to a sensor holder which is not shown. The inside of the fitting portion 62 is filled with sealing resin 64. The lower end of the fitting portion 62 and the spacer 60 are inserted into a masking holder 66.

The masking holder 66 has a lower end curved inside. A mask 70 is disposed at the curbed portion 68. The outer surface of the lower end of the masking holder 66 is formed with a male screw portion 72. A ring-shaped protective member 74 is threadedly attached to the male screw portion 72. The protective member 74 is formed of, for example, a urethane resin, and the lower end of the protective member 74 projects downwardly from the lower end of the curbed portion 68 of the masking holder 66 at the lower surface of the magnetic sensor 30. A reference numeral 75 represents a lead wire to produce the detection signal supplied from the magnetic resistance element 12.

Figure 7:
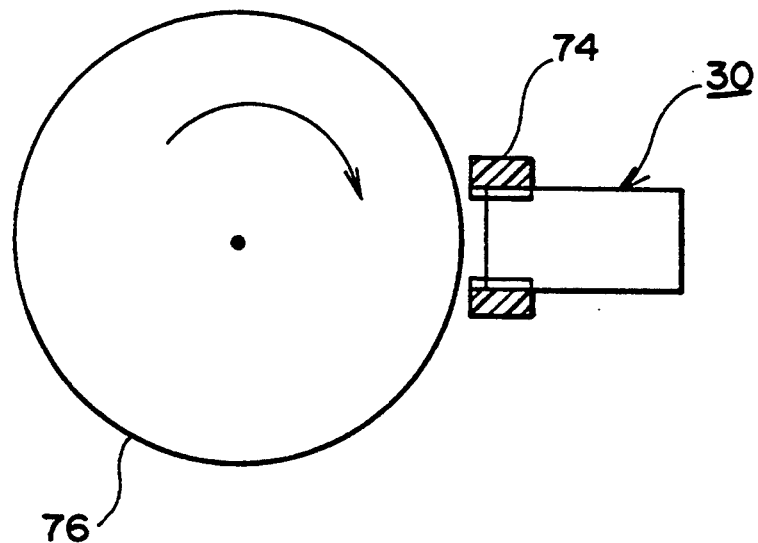
FIG. 7 is a view for use in describing the use of the fourth embodiment.
Figure 8A:
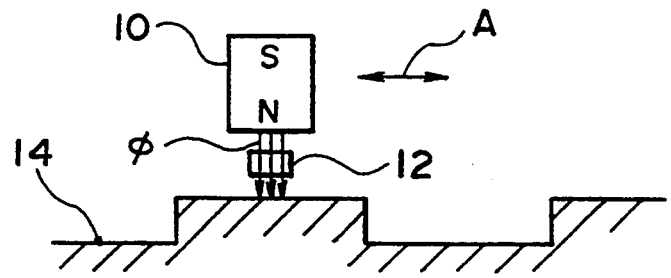
FIGS. 8 (A), (B), and (C) are operational diagrams of a conventional magnetic sensor.
Figure 8B:
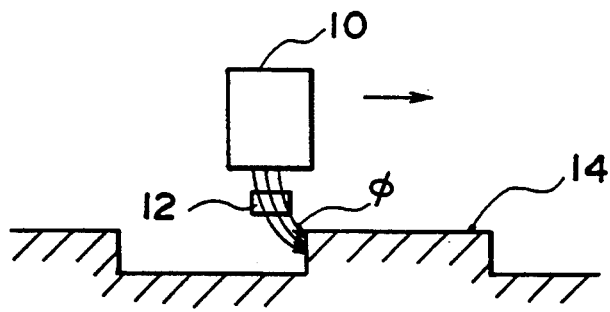
Figure 8C:
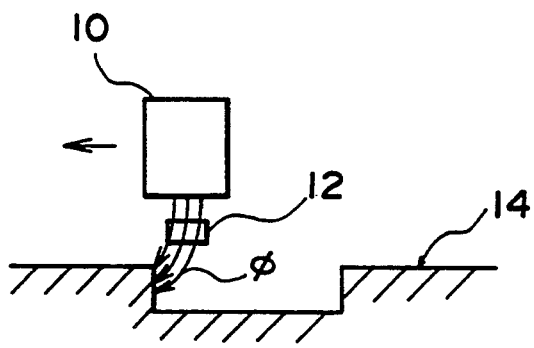
Figure 14:
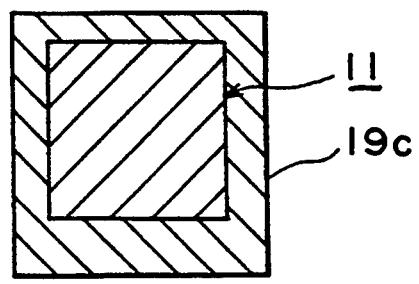
FIG. 14 is a front sectional view in which a conventional sensor body is contained in a protective case.

With this structure, when the magnetic sensor 30 is used in closer relation to the rotary disk 76 as the detected member as shown in FIG. 7, it is possible to prevent the magnetic sensor 30 from being damaged or worn because the magnetic sensor 30 is protected by the protective member 74. It is true even when the rotary disk 76 is shifted into contact with the magnetic sensor 30. In addition, the protective member 74 is threadedly attached to the magnetic sensor 30, which contributes to avoiding the slip-off of the magnetic sensor 30 due to impact or vibration caused by the contact of the rotary disk 76. Further, it is unnecessary to cover the entire structure of the magnetic sensor 30 as with the case of FIG. 14, so that the raising of the cost can be avoided. Moreover, by means of forming the protective member 74 with any material having high bumping ability such as polyurethane, vibration resistance of the magnetic sensor 30 can be improved. These effects can equally be obtained when it is used as a linear sensor or the like.

The protective member 74 can be changed arbitrary depending on the circumstances. For example, when the sensor is used in contact with the rotary disk 76, it is preferable to form the protective member with a fluorocarbon resin having good scoring resistance and good slidability. In this event, the contacting portion of the protective member 74 can coincide with the curvature of the rotary disk 76.

Alternatively, the protective member 74 can be a synthetic epoxy resin having good heat resistance, super engineering plastic having good heat resistance and slidability, or a phenol resin having good incombustibility. This protective member 74 is threadedly attached to the magnetic sensor 30, so that generalized size can provide interchangability thereof. In addition, although the present embodiment has thus been described in conjunction with the magnetic sensor 30, the sensor is not limited thereto and an optical sensor or the like can be equally applicable.

INDUSTRIAL APPLICABILITY

The present invention is useful as a magnetic sensor having high detection precision, capable of avoiding a magnetic disturbance, as well as having simple structure of sensor mounting. It can be well applied under a hostile environment such as construction equipment.

What is claimed is:

1. A magnetic sensor for detecting variations in a magnetic field along a line of relative movement, said sensor comprising:
   a sensor housing formed primarily of non-magnetic material;
   a magneto-resistive element for converting magnetic variation into an electrical signal, said magneto-resistive element being positioned within said sensor housing and having a back surface, a detection surface, and a side extending from said back surface to said detection surface;
   a magnetic field generator positioned within said sensor housing and adjacent to said back surface of said magneto-resistive element to generate a magnetic field having a magnetic field component crossing said magneto-resistive element at least generally perpendicularly to said detection surface of said magneto-resistive element; and a ferromagnetic member positioned adjacent to and outwardly of said side of said magneto-resistive element along said line of relative movement so as to form a portion of said sensor housing and to bend the magnetic field generated by said magnetic field generator to thereby cause a component of said magnetic field to extend through said magneto-resistive element at least substantially parallel to said detection surface and along said line of relative movement.

2. A magnetic sensor in accordance with claim 1, wherein said ferromagnetic member is a ring member positioned about the periphery of said side of said magneto-resistive element.

3. A magnetic sensor in accordance with claim 1, wherein said magneto-resistive element is mounted on a side of a support member, and wherein said ferromagnetic member is a ring member positioned about the entire periphery of said side of said support member.

4. A magnetic sensor in accordance with claim 3, further comprising a detected member having a magnetic scale thereon, one of said detected member and said magneto-resistive element being movable so as to provide relative movement between said detected member and said magneto-resistive element along said line of relative movement.

5. A magnetic sensor in accordance with claim 4, wherein said relative movement occurs in either direction along said line of relative movement.

6. A magnetic sensor in accordance with claim 1, wherein a support member is positioned between said magneto-resistive element and said magnetic field generator, wherein there are a plurality of magneto-resistive elements mounted on a side of said support member remote from said magnetic field generator so as to have first and second magneto-resistive elements spaced apart from each other along said line of relative movement.

7. A magnetic sensor in accordance with claim 6, wherein said support member has a center, and wherein said first magneto-resistive element is mounted on said side of said support member to one side of said center and said second magneto-resistive element is mounted on said side of said support member to the opposite side of said center, wherein said ferromagnetic member is positioned adjacent to said first magneto-resistive element along said line of relative movement, and wherein a second ferromagnetic member is positioned adjacent to and outwardly of said second magneto-resistive element along said line of relative movement.

8. A magnetic sensor in accordance with claim 1, further comprising a detected member having a magnetic scale thereon, one of said detected member and said magneto-resistive element being movable so as to provide relative movement between said detected member and said magneto-resistive element.

9. A magnetic sensor in accordance with claim 8, wherein said relative movement occurs in either direction along said line of relative movement.

10. A magnetic sensor in accordance with claim 9, wherein a support member is positioned between said magneto-resistive element and said magnetic field generator, wherein there are a plurality of magneto-resistive elements mounted on a side of said support member which is remote from said magnetic field generator.

11. A magnetic sensor in accordance with claim 10, wherein said support member has a center, and wherein at least one of said plurality of magneto-resistive elements is mounted on said side of said support member to one side of said center and at least one other of said plurality of magneto-resistive elements is mounted on said side of said support member to the opposite side of said center.

12. A magnetic sensor in accordance with claim 11, further comprising a weak ferromagnetic material arranged about at least one of the periphery of said magneto-resistive element and said detection surface of said magneto-resistive element, said weak ferromagnetic material comprising a ferromagnetic powder dispersed in a material selected from the group consisting of resins and rubbers.

13. Apparatus comprising a magnetic sensor and a holder therefor, said magnetic sensor having a sidewall and comprising:

a magneto-resistive element for converting magnetic variation into an electrical signal;

a magnetic field generator positioned adjacent to said magneto-resistive element to generate a magnetic field having a magnetic field component crossing said magneto-resistive element at least generally perpendicularly to a surface of said magneto-resistive element;

said holder having a sensor hole, formed therein by a sensor hole sidewall, in which said magnetic sensor is positioned so as to form a cavity between the sidewall of said sensor hole and said sidewall of said magnetic sensor, an elastic deforming member interposed between the sidewall of said sensor hole and said sidewall of said magnetic sensor, and means for pressing said magnetic sensor outwardly of said sensor hole;

wherein said means for pressing comprises a spring;

wherein said elastic deforming member comprises an elastic ring member; and wherein one of said sidewall of said magnetic sensor and said sidewall of said sensor hole has a peripheral groove formed therein, and said elastic ring member is positioned in said groove in contact with each of said holder and said magnetic sensor.

14. A structure comprising a magnetic sensor in accordance with claim 1, further comprising a protective member mounted to and projecting from the magnetic sensor to protect the magnetic sensor, said protective member being threadedly attached to the magnetic sensor.

15. A magnetic sensor comprising:

a magneto-resistive element for converting magnetic variation into an electrical signal, said magneto-resistive element having a periphery, a front surface, and a back surface;

a magnetic field generator positioned adjacent to the back surface of said magneto-resistive element to generate a magnetic field having a magnetic field component crossing said magneto-resistive element at least generally perpendicularly to the front surface of said magneto-resistive element;

a ferromagnetic member positioned adjacent to said magneto-resistive element to cause a component of said magnetic field to extend at least substantially parallel to said front surface; and a weak ferromagnetic material arranged at at least one of the periphery of said magneto-resistive element and the front surface of said magneto-resistive element, said weak ferromagnetic material comprising a ferromagnetic powder dispersed in a material selected from the group consisting of resins and rubbers.

16. A structure comprising a magnetic sensor in accordance with claim 15, further comprising a protective member mounted to and projecting from the magnetic sensor to protect the magnetic sensor from contact, said protective member being threadedly attached to an outer periphery of said magnetic sensor.

17. A structure comprising:
 a magneto-resistive element for converting magnetic variation into an electrical signal;
 a magnetic field generator positioned adjacent to said magneto-resistive element to generate a magnetic field having a magnetic field component crossing said magneto-resistive element at least generally perpendicularly to a surface of said magneto-resistive element;
 a ferromagnetic member positioned adjacent to said magneto-resistive element to cause a component of said magnetic field to extend at least substantially parallel to said surface;
 a holder containing said magneto-restrictive element, said magnetic field generator, and said ferromagnetic member;
 a detected member having a magnetic scale thereon, one of said detected member and said holder being movable so as to provide relative movement between said detected member and said magneto-resistive element; and
 a protective member positioned so as to project outwardly from said-holder to protect the holder from contact with said detected member, said protective member being threadedly attached to an outer periphery of said holder.

* * * * *